(12) United States Patent
Lamb et al.

(10) Patent No.: US 6,429,707 B1
(45) Date of Patent: Aug. 6, 2002

(54) REFERENCE SIGNAL SWITCHOVER CLOCK OUTPUT CONTROLLER

(75) Inventors: Jonathan Lamb, Ringwood; Wolfgang Bruchner, Southampton; Richard Lansdowne, Eastleigh, all of (GB)

(73) Assignee: Semtech Corporation, Newbury Park, CA (US)

( * ) Notice: Subject to any disclaimer, the term of this patent is extended or adjusted under 35 U.S.C. 154(b) by 0 days.

(21) Appl. No.: 09/911,642

(22) Filed: Jul. 19, 2001

Related U.S. Application Data
(60) Provisional application No. 60/287,229, filed on Apr. 27, 2001.

(51) Int. Cl.[7] .............................................. H03L 7/06
(52) U.S. Cl. ...................................... 327/159; 327/150
(58) Field of Search ................................ 327/150, 159, 327/144, 146, 147, 156; 375/373, 375, 376

(56) References Cited

U.S. PATENT DOCUMENTS 5,159,292 A * 10/1992 Canfield et al. ............ 331/1 A
5,883,533 A * 3/1999 Matsuda et al. ............ 327/156
5,905,388 A * 5/1999 Van Der Valk et al. ..... 327/107
5,970,110 A * 10/1999 Hung-Sung ................. 327/115

* cited by examiner

Primary Examiner—Toan Tran
Assistant Examiner—Linh Nguyen
(74) Attorney, Agent, or Firm—Thelen Reid & Priest LLP; David B. Ritchie

(57) ABSTRACT

A clock output controller using a digital frequency synthesis minimizes the clock output disturbance due to input reference signal switchover. The controller includes a first and a second accumulator where the Most Significant Bit (MSB) of the first accumulator output generates the clock output signal and the MSB of the second accumulator generates a feedback signal. A reset control signal is generated by the transition edge detector/switchover controller and it is coupled to the register block of the second accumulator in order to reset the feedback signal at an appropriate time so as to match the phase of the new reference signal. A hold control signal is also generated to keep the clock output locked on the old reference signal until the feedback signal is locked to the new signal. The hold signal is then reset once locking to the new reference signal is accomplished and the clock output is fully switched over with minimal disturbance.

18 Claims, 3 Drawing Sheets

REFERENCE SIGNAL SWITCHOVER CLOCK OUTPUT CONTROLLER

CROSS-REFERENCE TO RELATED APPLICATION

This application claims priority based on U.S. Provisional Application Ser. No. 60/287,229, filed Apr. 27, 2001.

FIELD OF THE INVENTON

This invention relates to controlling the clock output of a digital phase-locked loop (PLL) in order to minimize the phase and the frequency disturbances resulting from input source switchover.

BACKGROUND OF THE INVENTION

A standard phase-locked loop (PLL) circuit generally functions to lock its output clock so as to coincide in time with an input reference signal clock. Typically, a phase difference between the two clocks of zero degrees is the design target. PLL circuits can be implemented in either predominately digital or analog fashion, where the primary difference is in the way the output clock function is constructed. The analog PLL may, for example, employ a voltage-controlled oscillator (VCO), while a digital PLL may employ a digital accumulator circuit where the most significant bit (MSB) is typically used to form the output clock. Regardless of the specific type of PLL circuit, difficulties can arise when the system must switch over and select between more than one input reference signal. This requirement is common in modern telecommunications networks where different switches and routers may operate under different clock regimes. As packets, for example, are passed from one router to the next, the synchronizing clock of the first router may also be passed to the second router for data or flow control purposes.

The local PLL circuits must be equipped to handle the input reference signal switchover, where the signals may differ in frequency, phase, or both. It is common to have only phase variations between the old and the new reference signals, but it remains difficult to maintain the clock output because it must shift so as to align, or coincide in time, with the new input reference signal. The problem appears as a phase jump or as a disturbance on the output of the PLL, which is an undesirable aspect in many applications.

Now, a solution that is known in the art pertaining to analog PLL systems will be described.

Particularly for analog PLL systems, a programmable delay line can be used to minimize the clock output phase disturbance. When an input reference signal switchover occurs, a delayed version of the PLL output clock is extracted at a point where the output signal phase is about equivalent to the phase of the new reference signal. This delayed PLL output clock version is then used as the feedback signal essential to close the control loop.

FIG. 1 is a diagram representative of this approach, indicated by the general reference character 100. The reference signals, C1 and C2, connect to a first multiplexer circuit 102 and also to the phase difference measurement logic and control block 120. The output of first multiplexer 102 connects as the first input to the phase and frequency detection block 104. The output of block 104 serves as the input to the loop filter/oscillator block 106. The output of block 106 connects as the input to the clock delay line 108. The individual delay stage outputs 112-0 to 112-n are inputs to a second multiplexer 114. Also, the clock output signal 110 is derived from an intermediate delay line point. The feedback signal 116 is the output of the second multiplexer 114 and it is also the second input to the phase and frequency detection block 104. Finally, the selection control 118 for the second multiplexer is generated by block 120.

The basic operation of the system 100 is well known and understood in the art. The essential features of this approach during the switchover of the input reference signals will now be described.

If the circuit is already phase-locked to reference signal C1, clock output 110 will effectively track this reference signal. One of the individual delay stage outputs 112-0 to 112-n will be selected via the selection control 118 so as to provide the appropriate feedback signal 116 so that there is phase alignment between the feedback signal and C1. This effectively implements a programmable delay line between the output of oscillator 106 and the feedback signal. When a reference signal switchover occurs, say, from reference signal C1 to reference signal C2, the selection control 118 changes so that a different selection of the delay stage outputs 112-0 to 112-n is made. Thus, the new programmable delay tap point is selected so that the phase of the clock output 110 about matches the phase of the new reference signal, C2.

The approach described above serves to minimize the phase adjustment and disturbance on the clock output during the described reference signal switchover; however, there are several limitations and disadvantages associated with this approach to the problem. First, because of reasonable physical circuit implementation limits, there is an effective limit to the total length of the delay elements that can be constructed (i.e., the silicon chip area implementation cost can be high). Second, the delay stage size, or the effective delay of each stage, sets an incremental limit on the overall programmable delay line. This can make it more difficult to phase match the new reference signal because the phase difference between the old and the new reference signals may fall within the delay of a given delay stage, possibly resulting in clock output disturbances upon reference signal switchover or difficulty in ultimately phase matching the clock output to the new reference signal. A way to address this issue could be to implement the delay line using delay stages of different delay values (i.e., delay granularities), but this leads to physical implementation and delay matching difficulties.

A third disadvantage of the approach described above is that most delay line implementations are highly susceptible to variations in operating temperature, power supply voltage levels, and manufacturing processes. These factors could manifest as clock output phase disturbances becoming apparent under certain operating conditions, but not others, for the same reference signal switchover situation and reference signal characteristics, as an example. A fourth concern relates to the finite range of the delay line. For large phase mismatches, it may not provide enough delay for phase matching. If the minimum delay stage increment is too large for a small phase difference, this can also be a problem for phase locking, depending on the phase difference tolerances of the system. Finally, the approach described above requires a relatively complex control system in order to fine tune the selection of the appropriate delay tap point.

It would be desirable to arrive at some way of providing clock output control during reference signal switchover that is less complicated, is more reliable over the expected operating conditions and process variations, and is generally more flexible than other conventional approaches.

SUMMARY OF THE INVENTION

A Phase Locked Loop (PLL) system employing a digital frequency synthesis technique is coupled to a pair of accumulators and associated control circuitry. The clock output signal is generated from the most significant bit (MSB) of the first accumulator output. The feedback signal is generated from the MSB of the second accumulator output. Based on master switchover control notification that an input reference switchover will occur, a transition edge detector/switchover controller block places the system in a hold mode. The transition edge detector/switchover controller also generates the multiplexer control signal and the reset control signal. The reset control signal initializes the state of the second accumulator based on a phase comparison between the old and the new reference signals. In this way, the feedback signal closely approximates the new reference signal. Finally, the system is fully switched over to accept the new reference signal through the multiplexer and the system is taken out of the hold mode.

An advantage of the invention is that the disturbance on the clock output during the reference signal switchover is minor.

Another advantage of the invention embodiment is that the system performance is largely independent of variations in operating temperature, supply voltage, or manufacturing process because of the digital nature of the design.

Another advantage of the invention is that there is no delay line limitation due to the digital accumulator structure driving the feedback loop.

Another advantage of the invention is that the system time resolution is limited by the local control clock rate, as opposed to an analog delay stage element.

Yet another advantage of the invention is that a relatively simple input phase measuring system can be employed to set the effective delay of the feedback signal.

BRIEF DESCRIPTION OF THE DRAWINGS

The accompanying drawings, which are incorporated into and constitute a part of this specification, illustrate one or more exemplary embodiments of the present invention, and together with the detailed description, serve to explain the principles and exemplary implementations of the invention.

In the drawings.

DETAILED DESCRIPTION OF SPECIFIC EMBODIMENTS OF THE INVENTION

A specific embodiment of the present invention is described herein in the context of a reference signal switchover clock output controller. Those of ordinary skill in the art will realize that the following description of the present invention is illustrative only and is not intended to be in any way limiting. Other embodiments of the invention will readily suggest themselves to such skilled persons having the benefit of this disclosure. Reference will now be made in detail to an implementation of the present invention as illustrated in the accompanying drawings.

In the interest of clarity, not all of the routine features of, the implementations herein are described. It will of course be appreciated that in the development of any such actual implementation, numerous implementation-specific decisions must be made to achieve the developers' specific goals, such as compliance with system- and business-related constraints, and that these goals will vary from one implementation to another. Moreover, it will be appreciated that such a development effort might be complex and time-consuming, but would nevertheless be a routine undertaking of engineering for those of ordinary skill in the art having the benefit of this disclosure.

Figure 1:
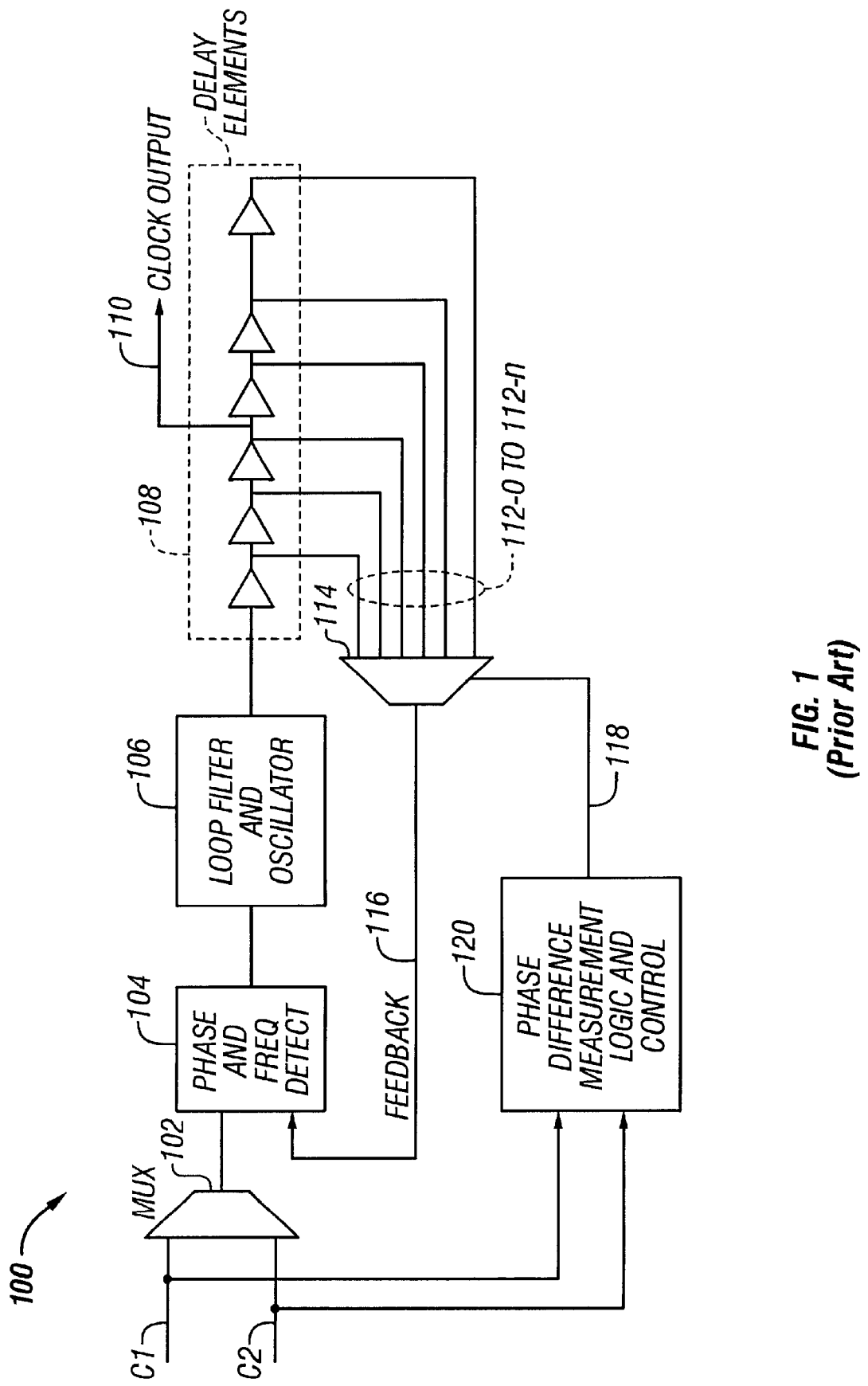
FIG. 1 is a schematic block diagram illustrative of a clock output controller in accordance with the prior art.
Figure 2:
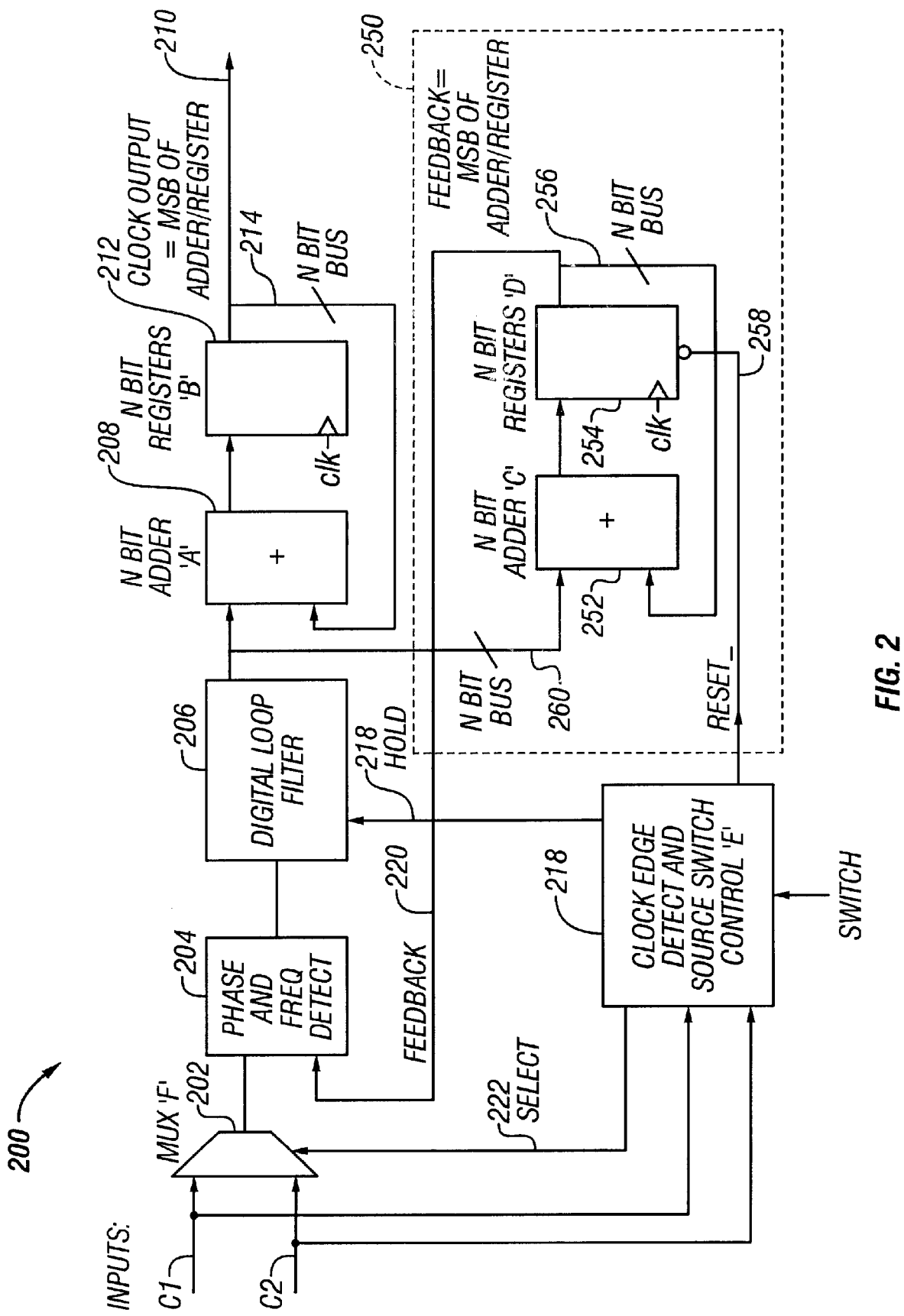
FIG. 2 is a schematic block diagram of a specific embodiment of the present invention.

FIG. 2 shows a schematic block diagram of a specific embodiment of the present invention in the system indicated by the general reference character 200. The input reference signals shown are C1 and C2. These reference signals can connect to multiplexer 202 and also to transition edge detector/switchover controller 218. The output of multiplexer 202 can connect to a first input of phase/frequency detector 204. The output of the phase/frequency detector can connect to digital loop filter 206. The system can include two accumulators. The first accumulator can include adder 208 coupled to register block 212. The second accumulator 250 can include adder 252 coupled to register block 254. The digital loop filter 206 can generate increment value bus 260 that can couple to each of the two accumulators. The first accumulator output bus 214 can connect as an input to adder 208. The second accumulator output bus 256 can connect as an input to adder 252. The clock output signal 210 can be generated from the MSB of the first accumulator output bus 214. Feedback signal 220 can be generated from the MSB of the second accumulator output bus 256. Reset control signal 258 can be generated by the transition edge detector/switchover controller 218 and it can connect to register block 254 of the second accumulator. The transition edge detector/switchover controller block can also generate a multiplexer control signal 222, which can couple to the multiplexer 202, and a hold control signal 216, which can couple to the digital loop filter 206. Finally, each of the register blocks, 212 and 254, can receive a local control clock signal.

Referring now to the timing diagram of FIG. 3 and viewing this diagram in conjunction with FIG. 2, the reference source switchover control of the circuit will be described by way of example.

In the example, the digital PLL is locked to the C1 input reference signal and a switchover may be made to the C2 reference signal that differs in phase relative to C1, but shares the same frequency. The local control clock, CLK, is shown in FIG. 3. The frequency of this clock can be much greater than the frequency of any of the reference signals. This local control clock frequency should be as high as the underlying circuitry allows so as to provide the finest phase locking granularity possible in the technology chosen for implementation. In the example, the frequency of the local clock is five times greater than either reference signal.

Figure 3:
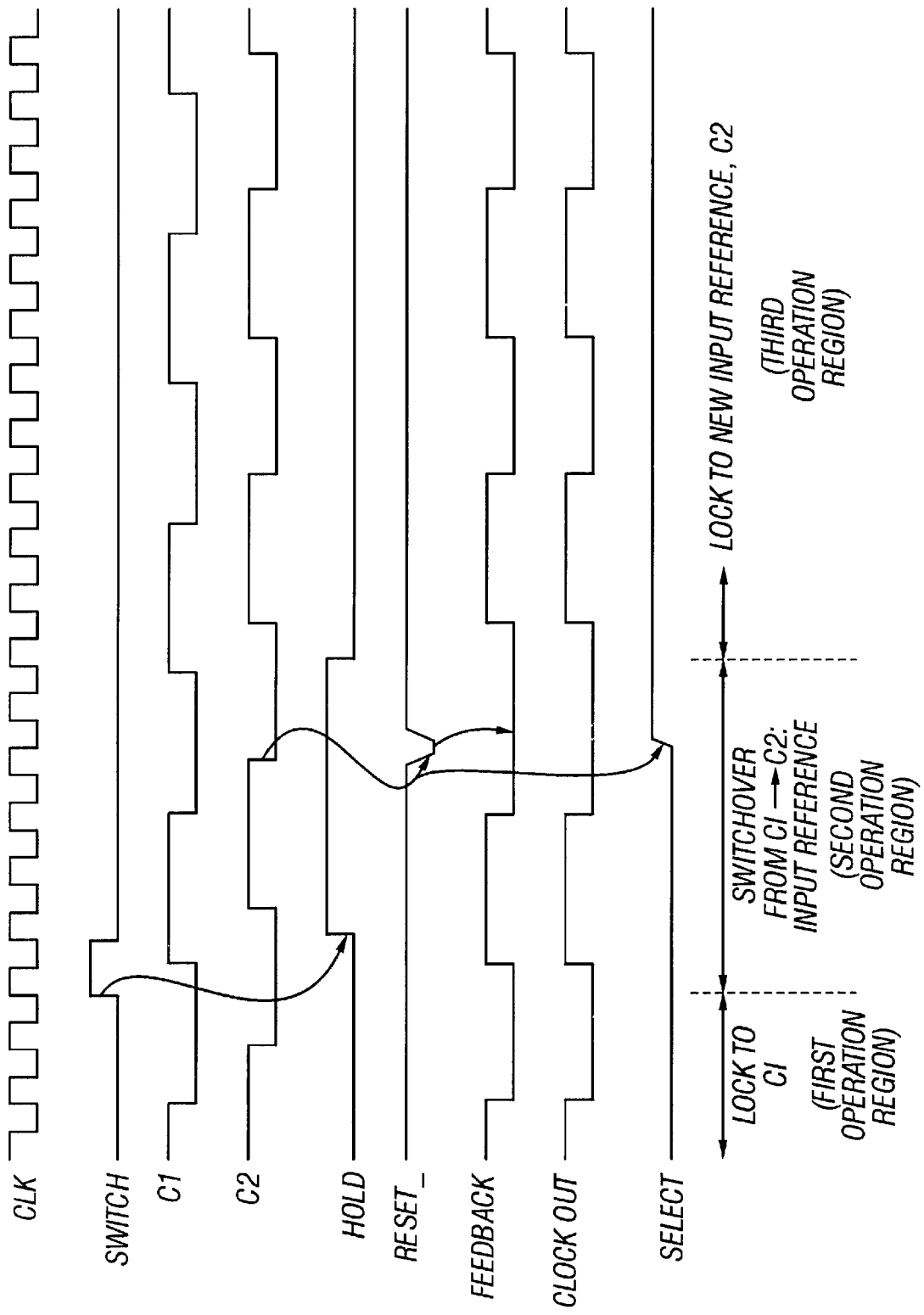
FIG. 3 is a timing diagram illustrative of the control operation of a specific embodiment of the present invention.

FIG. 3 shows the first operation region (i.e., state of control) where the clock output, CLOCK OUT, tracks and is locked to selected reference signal C1. The feedback signal, FEEDBACK, is also locked with selected reference signal C1 during this region. The system may stay in this region until it receives the master switchover control.signal, SWITCH, indication. The SWITCH signal can go high to indicate that a reference signal switchover is coming and this initiates the second operation region. The transition edge detector/switchover controller can receive this signal and then can assert the hold control signal, HOLD. In this example, it should also be noted that the output clock synchronizes to the phase of a reference signal based on phase comparison at the low-to-high transition edge. During the reference signal switchover period, the reset signal, RESET__ can be asserted, as a low-going pulse, on the following high-to-low transition edge. of reference signal C2. This timing can allow for the subsequent low-to-high transition edge of FEEDBACK to be approximately coincident in time with the new input reference signal, C2. Also, the multiplexer selection signal, SELECT, can go high to select the new reference signal so that the system is fully locked onto the C2 reference signal. To end the second operation region, HOLD can discharge. The third operation region begins when HOLD has discharged. The CLOCK OUT and FEEDBACK signals can then remain locked to the new reference signal selection, C2.

The example shows only two reference signals, but as it is clear to one skilled in the art, that more than two signals could be included in the system. Also, while the example described two reference signals with the same frequency, reference signals could also differ in frequency. In order to accommodate this, the increment value bus could supply a unique increment value bus to the first accumulator and a different unique value bus to the second accumulator. This could enable locking to the different frequency of the new reference signal without allowing any clock output disturbance.

While embodiments and applications of this invention have been shown and described, it would be apparent to those of ordinary skill in the art having the benefit of this disclosure that many more modifications than mentioned above are possible without departing from the inventive concepts herein. The invention, therefore, is not to be restricted except in the spirit of the appended claims.

What is claimed is:

1. A clock output controller comprising:

a multiplexer receiving a plurality of reference signals and a multiplexer control signal and outputting a selected one of the plurality of reference signals based on the state of the multiplexer control signal;

a transition edge detector/switchover controller receiving the plurality of reference signals and a master switchover control signal and outputting a hold control signal, a reset control signal, and the at least one multiplexer control signal;

a phase/frequency detector receiving the output of said muliplexer and a feedback signal and coupled to a digital loop filter;

the digital loop filter receiving the hold control signal and outputting an increment value bus;

a first accumulator receiving the increment value bus and outputting a clock output signal; and a second accumulator receiving the increment value bus and the reset control signal and outputting the feedback signal.

2. The clock output controller of claim 1 wherein:

the clock output signal includes the most significant bit (MSB) of the first accumulator.

3. The clock output controller of claim 1 wherein:

the feedback signal includes the most significant bit (MSB) of the second accumulator.

4. The clock output controller of claim 1 wherein:

said first accumulator includes an adder coupled to a register.

5. The clock output controller of claim 1 wherein:

said second accumulator includes an adder coupled to a register.

6. The clock output controller of claim 4 or claim 5 wherein:

each said register receives a local control clock signal.

7. The clock output controller of claim 1 wherein:

the reset control signal is activated upon detection of a transition edge of one of said plurality of reference signals.

8. The clock output controller of claim 7 wherein:

the reset control signal is activated upon detection of the high-to-low transition edge of one of said plurality of reference signals.

9. The clock output controller of claim 1 wherein:

the hold control signal is activated subsequent to activation of the master switchover control signal.

10. The clock output controller of claim 1 wherein:

said second accumulator is reset to a predetermined default state upon activation of the reset control signal.

11. A digital phase-locked loop comprising:

means for producing a clock output signal with phase locking to a first transition edge of a first reference signal including a first accumulating means;

means for switching over from the clock output signal locking to the first transition edge of the first reference signal to the clock output signal locking to the first transition edge of a second reference signal with minimal disturbance on the clock output signal; and means for resetting a second accumulating means to approximate the phase of the second reference signal upon switchover from the first reference signal to the second reference signal.

12. The digital phase-locked loop of claim 11 wherein:

said means for resetting includes means for activating a reset control signal upon detection of a second transition edge of the second reference signal.

13. A method for controlling a clock output comprising:

synchronizing a clock output to a first transition edge of a first reference signal using digital frequency synthesis including supplying an increment value to a first accumulator;

receiving an indication that the clock output will synchronize to the first transition edge of a second reference signal;

entering a holding control mode;

detecting a second transition edge of the second reference signal;

resetting a second accumulator;

switching a multiplexer to select the second reference signal; and exiting the holding control mode.

14. A method for controlling a clock output in accordance with claim 13, further comprising:

activating a hold control signal upon entering the holding control mode.

15. A method for controlling a clock output in accordance with claim 13, further comprising:

activating a control signal upon detecting the second transition edge of the second reference signal.

16. A method for controlling a clock output in accordance with claim 13, further comprising:

resetting the second accumulator using a reset control signal.

17. A method for controlling a clock output in accordance with claim 13, further comprising:

activating a multiplexer control signal to switchover the multiplexer coincident with the resetting of the second accumulator.

18. A method for controlling a clock output in accordance with claim 13, further comprising:

deactivating the hold control signal upon exiting the holding control mode.

* * * * *